(12) United States Patent
Kawamata

(10) Patent No.: US 6,711,055 B2
(45) Date of Patent: Mar. 23, 2004

(54) NONVOLATILE SEMICONDUCTOR MEMORY DEVICE OF DUAL-OPERATION TYPE WITH DATA PROTECTION FUNCTION

(75) Inventor: Junya Kawamata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/263,646

(22) Filed: Oct. 4, 2002

(65) Prior Publication Data

US 2003/0076730 A1 Apr. 24, 2003

(30) Foreign Application Priority Data

Oct. 18, 2001 (JP) .......................... 2001-320909

(51) Int. Cl.[7] ............................................ G11C 16/04
(52) U.S. Cl. ................... 365/185.04; 365/195
(58) Field of Search ............... 365/185.04, 195, 365/196, 230.03; 711/152, 163, 164

(56) References Cited

U.S. PATENT DOCUMENTS 5,097,445 A * 3/1992 Yamauchi ................. 365/195
5,881,002 A * 3/1999 Hamakawa ................ 365/195
6,009,495 A * 12/1999 DeRoo et al. ............. 711/103
6,031,757 A * 2/2000 Chuang et al. ......... 365/185.04
6,130,836 A * 10/2000 Matsubara et al. ..... 365/185.03

* cited by examiner

Primary Examiner—Son Mai
(74) Attorney, Agent, or Firm—Arent Fox Kintner Plotkin & Kahn, PLLC

(57) ABSTRACT

A nonvolatile semiconductor memory device includes a plurality of banks including respective memory cell arrays independent of each other, a password storage area that is associated with one of the banks, a bank decoder which generates a bank selection signal by decoding a bank address, a first bank selection circuit which outputs a write instruction or a read instruction to the one of the banks, a plurality of second bank selection circuits which outputs a write instruction or a read instruction to the respective banks except for the one of the banks, and a command-decode-&-bank-control circuit which controls the first and second bank selection circuits such that receipt of a first command causes one of the first and second bank selection circuits selected by the bank selection signal to output a write instruction or a read instruction, and such that receipt of a second command causes the first bank selection circuit to output a write instruction independently of the bank selection signal, and causes one of the second bank selection circuits selected by the bank selection signal to output a read instruction.

10 Claims, 7 Drawing Sheets

NONVOLATILE SEMICONDUCTOR MEMORY DEVICE OF DUAL-OPERATION TYPE WITH DATA PROTECTION FUNCTION

BACKGROUND OF THE INVENTION

1. Field of the Invention

The present invention generally relates to nonvolatile semiconductor memory devices, and particularly relates to a nonvolatile semiconductor memory device provided with a data protection function based on the use of passwords.

2. Description of the Related Art

In nonvolatile semiconductor memory devices of a dual-operation type, a memory cell array is divided into four banks, for example, and a read operation can be performed on a selected bank while a rewrite operation (program-&-erase operation) is being performed on another bank.

FIG. 1 is a block diagram showing a schematic configuration of a nonvolatile semiconductor memory device of a dual-operation type.

A nonvolatile semiconductor memory device 10 includes a command register 11, a command decoder 12, a control circuit 13, a latch-signal generation circuit 14, a bank decoder 15, a bank control circuit 16, a bank-A selection circuit 17, a bank-B selection circuit 18, a bank-C selection circuit 19, a bank-D selection circuit 20, a bank-A 21, a bank-B 22, a bank-C 23, and a bank-D 24.

The command register 11 receives command signals and control signals from an exterior of the device, and supplies them to the command decoder 12. The command decoder 12 decodes the commands, and supplies the decoded commands to the control circuit 13 and the bank control circuit 16. The control circuit 13 is a state machine that controls internal circuitry of the nonvolatile semiconductor memory device 10 based on the decoded commands supplied thereto.

The latch-signal generation circuit 14 generates a latch signal X in response to a chip-enable signal /CE or a write-enable signal /WE, and supplies the latch signal X to the bank selection circuits 17 through 20. The bank decoder 15 decodes a bank address supplied from the exterior of the device. The bank decoder 15 generates bank selection signals APBK, BPBK, CPBK, and DPBK for selecting respective banks according to the decoded bank address, and supplies them to the bank selection circuits 17 through 20. The bank selection circuits 17 through 20 generate signals ordering write operations and signals ordering read operations with respect to the respective banks 21 through 24. For example, the bank-A selection circuit 17 asserts a signal ABRSEL instructing the bank-A 21 to perform a read operation or a signal ABWSEL instructing the bank-A 21 to perform a write operation. Each of the banks 21 through 24 is provided with a memory cell array, an address decoder, and a control circuit, and carries out an operation selected from the write operation and the read operation.

The bank control circuit 16 receives a signal Z from the command decoder 12 indicative of receipt of a write command, and responds to this signal Z by supplying a read/write-selection signal Y for ordering a write operation to the bank selection circuits 17 through 20. If the entered bank address indicates the bank-A 21, for example, the bank decoder 15 asserts a signal APBK. With the bank selection signal APBK being asserted by the bank decoder 15, the bank-A selection circuit 17 latches a bank-selection state indicative of the selected status of the bank-A 21 in response to the latch signal X from the latch-signal generation circuit 14. Based on the latched bank selection state and the read/write-selection signal Y indicative of a write operation, the bank-A selection circuit 17 performs a write operation on the bank-A 21. In response, the bank-A 21 carries out a write operation.

Consideration will now be given to a particular situation in which the bank-A 21 is undergoing a write operation when a read command is entered into the command register 11 as a next command from the exterior, and a read bank address is input into the bank decoder 15. In response to the read command, the read/write-selection signal Y turns into a signal state indicative of a read operation. If the bank address indicates the bank-B 22, for example, the bank decoder 15 will asserts the bank selection signal BPBK. In response to the bank selection signal BPBK selecting the bank-B 22 and the read/write-selection signal Y indicative of a read operation, the bank-B selection circuit 18 instructs the bank-B 22 to perform a read operation. In response, the bank-B 22 carries out a read operation. When this happens, the write operation of the bank-A 21 continues to be performed concurrently with the read operation of the bank-B 22.

As described above, a nonvolatile semiconductor memory device of a dual-operation type can perform a read operation on a selected bank while performing a write operation (program-&-erase operation) on another bank.

Some of the nonvolatile semiconductor memory devices of today are provided with a protection function, which prohibits writing of memory contents on a sector-specific or block-specific basis where the sector refers to a unit by which memory is erased at a time, and the block refers to a plurality of such units. Information about memory areas (sectors or blocks) that are protected from writing is stored in a nonvolatile memory as a protection status. A control circuit (state machine) of the nonvolatile semiconductor memory device refers to this information so as to prohibit the writing of protected areas.

A password mode is provided for the purpose of preventing the protection status from being changed through unauthorized access. In the password mode, the nonvolatile memory that holds the protection status is locked so as not to be rewritten, thereby making it sure that the protection status cannot be changed in the default operation. This lock is disengaged if a password entered from the exterior matches the password stored in the nonvolatile memory, thereby making it possible to change the protection status. This unlocking operation is called a password unlock.

The area of the nonvolatile memory where the password is stored is called an OTP (one time protect) area, which is allocated to outside the main memory space. Once protected, the OTP area can never be unlocked. No access can be made to the OTP area in the normal access mode, and an OTP mode needs to be engaged in order to access the OTP area. In the OTP mode, a selected sector of the main memory space is logically replaced by the OTP area, so that an address for accessing the selected sector can be used to access the OTP area. Since a password is stored in part of the OTP area, use of the OTP mode is necessary whenever the password function is used.

In the nonvolatile semiconductor memory device 10 of FIG. 1, it is assumed that such an OTP area 25 is provided in the bank-A 21. When the OTP mode is activated, a selected sector of the bank-A 21 is logically replaced by the OTP area 25, so that an address for accessing this selected sector can be used to access the OTP area 25.

There is no need to inform users of the location where passwords are stored. In the password program operation (i.e., password setting operation), therefore, it is preferable to be able to set a password by entering only a password program command without entering an address that indicates a password address. Further, it is preferable to achieve a dual-operation in which a read operation on another bank can be performed simultaneously with the password program operation.

When a password program command is entered without an indication of any address, however, a bank selection status indicative of a bank other than the bank-A 21 may be latched by a bank selection circuit because an address input is of a "don't care" status. If the bank-C selection circuit 19 latches the bank selection status, for example, the bank-C 23 will be regarded as a bank to be written in response to the read/write-selection signal Y. In this case, it is not possible to carry out a read operation of the bank-C 23. In this case, further, the bank-C 23, rather than the bank-A 21, is a bank to be written, so that it is not even possible to perform a program operation of the OTP area 25 that is allocated to the bank-A 21.

Accordingly, there is a need for a nonvolatile semiconductor memory device of a dual-operation type that is capable of a password program operation without specifying a password address.

SUMMARY OF THE INVENTION

It is a general object of the present invention to provide a nonvolatile semiconductor memory device that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a nonvolatile semiconductor memory device particularly pointed out in the specification in such full, clear, concise, and exact terms as to enable a person having ordinary skill in the art to practice the invention.

To achieve these and other advantages and in accordance with the purpose of the invention, as embodied and broadly described herein, a nonvolatile semiconductor memory device according to the present invention includes a plurality of banks including respective memory cell arrays independent of each other, a password storage area that is associated with one of the banks, a bank decoder which generates a bank selection signal by decoding a bank address, a first bank selection circuit which outputs a write instruction or a read instruction to the one of the banks, a plurality of second bank selection circuits which outputs a write instruction or a read instruction to the respective banks except for the one of the banks, and a command-decoder-&-bank-control circuit which controls the first and second bank selection circuits such that receipt of a first command causes one of the first and second bank selection circuits selected by the bank selection signal to output a write instruction or a read instruction, and such that receipt of a second command causes the first bank selection circuit to output a write instruction independently of the bank selection signal, and causes one of the second bank selection circuits selected by the bank selection signal to output a read instruction.

In the nonvolatile semiconductor memory device as described above, upon receiving the second command that is a password program command, the first bank selection circuit corresponding to the bank associated with the password storage area (OTP area) outputs a write instruction regardless of the bank selection status. Other bank selection circuits (i.e., second bank selection circuits) output a read instruction when bank selection is made, rather than outputting a write instruction. Accordingly, even if a bank different from the bank associated with the password storage area is selected by the bank selection signal, no write operation is performed on that bank, thereby allowing a concurrent read operation to be performed on that bank by virtue of the dual-operation function. As for the bank associated with the password storage area, a program operation can properly be performed.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 2:
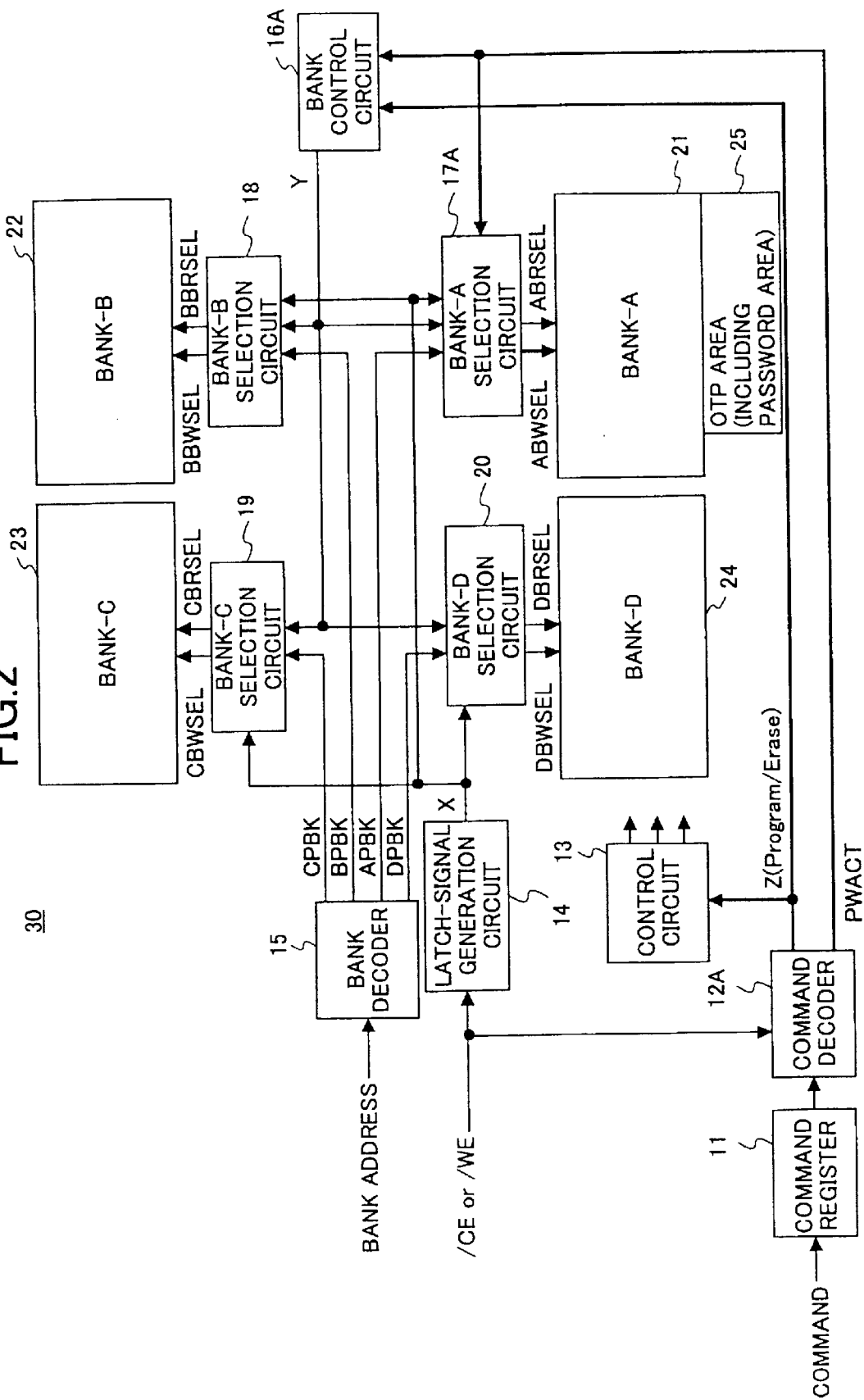
FIG. 2 is a block diagram showing a schematic configuration of a nonvolatile semiconductor memory device according to the present invention.

FIG. 2 is a block diagram showing a schematic configuration of a nonvolatile semiconductor memory device according to the present invention.

Figure 1:
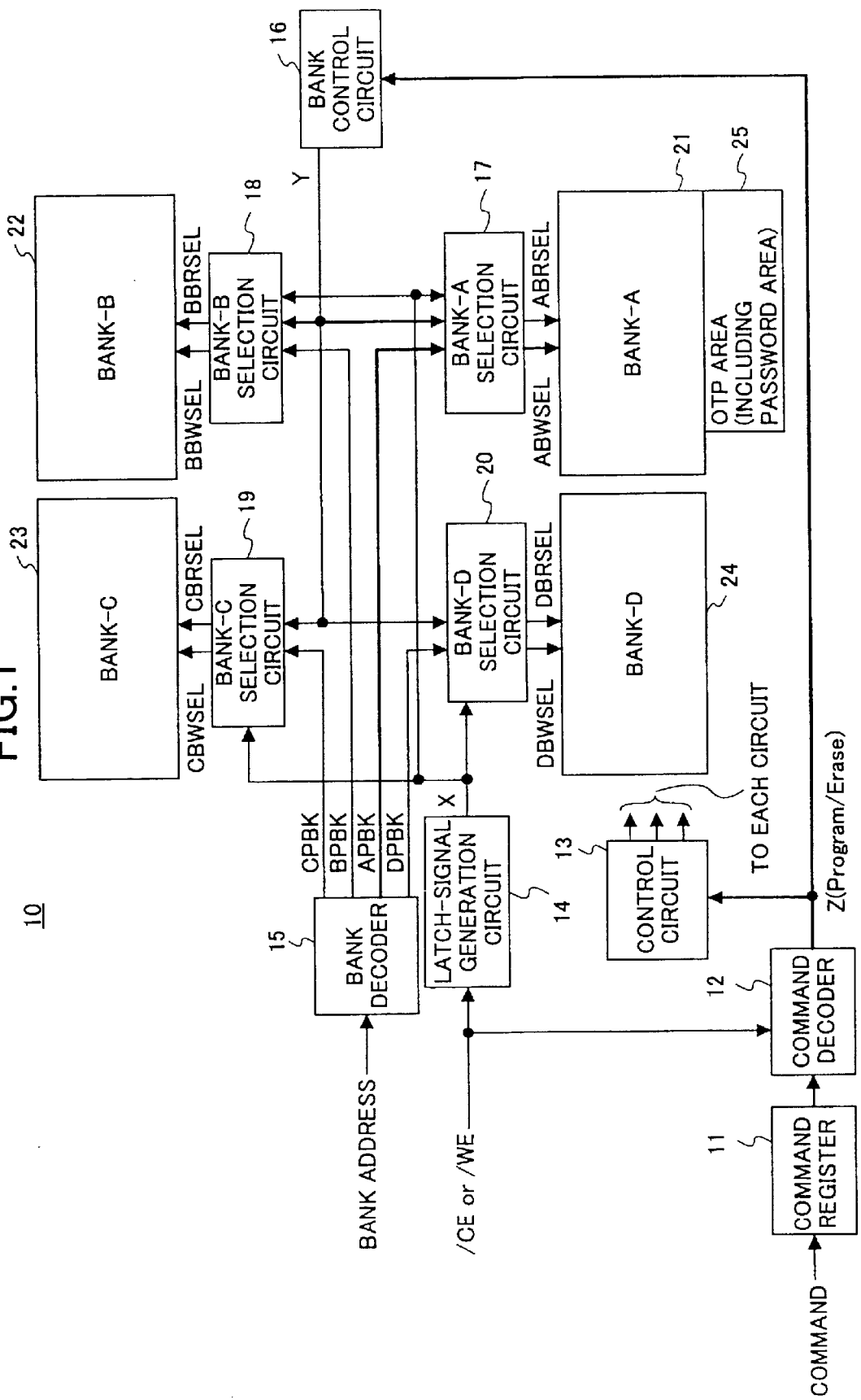
FIG. 1 is a block diagram showing a schematic configuration of a related-art nonvolatile semiconductor memory device of a dual-operation type.

A nonvolatile semiconductor memory device 30 of FIG. 2 includes the command register 11, a command decoder 12A, the control circuit 13, the latch-signal generation circuit 14, the bank decoder 15, a bank control circuit 16A, a bank-A selection circuit 17A, the bank-B selection circuit 18, the bank-C selection circuit 19, the bank-D selection circuit 20, the bank-A 21, the bank-B 22, the bank-C 23, the bank-D 24, and the OTP area 25. In FIG. 2, the same elements as those of FIG. 1 are referred to by the same numerals.

The command register 11 receives command signals and control signals from an exterior of the device, and supplies them to the command decoder 12A. The command decoder 12A decodes the commands, and supplies the decoded commands to the control circuit 13 and the bank control circuit 16A. The command decoder 12A asserts a signal Z indicative of receipt of a write command when a program or erase command is entered from the exterior of the device. When a password program command is entered from the exterior of the device, the command decoder 12A asserts the signal Z for the purpose of ordering a write operation, and also asserts a password operation signal PWACT.

The control circuit 13 is a state machine that controls internal circuitry of the nonvolatile semiconductor memory device 30 based on the decoded commands supplied thereto. If the signal Z is asserted, the control circuit 13 controls the internal circuitry such as to perform a write operation on a selected bank.

The latch-signal generation circuit 14 generates a latch signal X in response to a chip-enable signal /CE or a write-enable signal /WE, and supplies the latch signal X to the bank selection circuits. The bank decoder 15 decodes a bank address supplied from the exterior of the device. The bank decoder 15 generates bank selection signals APBK, BPBK, CPBK, and DPBK for selecting respective banks according to the decoded bank address, and supplies them to the respective bank selection circuits. The bank selection circuits 17A, 18, 19, and 20 generate signals ordering write operations and signals ordering read operations in respect of the respective banks 21 through 24. For example, the bank-A selection circuit 17A asserts a signal ABRSEL instructing the bank-A 21 to perform a read operation or a signal ABWSEL instructing the bank-A 21 to perform a write operation. Each of the banks 21 through 24 is provided with a memory cell array, an address decoder, and a control circuit, and carries out an operation selected from the write operation and the read operation.

In the case of write operation, the bank control circuit 16A receives a signal Z from the command decoder 12A indicative of receipt of a write command, and responds to this signal Z by supplying a read/write-selection signal Y for ordering a write operation to the bank selection circuits 17A, 18, 19, and 20. If the entered bank address indicates the bank-A 21, for example, the bank decoder 15 asserts a signal APBK. With the bank selection signal APBK being asserted by the bank decoder 15, the bank-A selection circuit 17A latches a bank-selection state indicative of the selected status of the bank-A 21 in response to the latch signal X from the latch-signal generation circuit 14. Based on the latched bank selection state and the read/write-selection signal Y indicative of a write operation, the bank-A selection circuit 17A performs a write operation on the bank-A 21. In response, the bank-A 21 carries out a write operation.

When the entered bank address indicates the bank-B 22, for example, the bank-B selection circuit 18 latches a bank selection status indicative of the selected state of the bank-B 22 in the same manner as described above. In response to the latched bank selected status and the read/write-selection signal Y indicative of a write operation, the bank-B selection circuit 18 instructs the bank-B 22 to carry out a write operation. In response, the bank-B 22 performs a write operation. The same operation as described here will be performed with respect to the bank-C 23 and the bank-D 24 when these banks are selected.

In the case of a password program operation, the bank control circuit 16A responds to the signal PWACT from the command decoder 12A indicative of receipt of a password program command by turning the read/write-selection signal Y into a signal state indicative of read operation. The signal PWACT is further supplied from the command decoder 12A to the bank-A selection circuit 17A.

The bank-A selection circuit 17A responds to the signal PWACT from the command decoder 12A by asserting a signal ABWSEL indicative of a write operation. With this, the bank-A selection circuit 17A orders the bank-A 21 to perform a write operation. In response, the bank-A 21 carries out a write operation on the OTP area 25. In this case, the bank-A selection circuit 17A asserts the above-noted signal ABWSEL indicative of a write operation regardless of the decoded signal supplied from the bank decoder 15.

With respect to the bank-B selection circuit 18, the bank-C selection circuit 19, and the bank-D selection circuit 20, no write operation is performed even if bank selection is made by a bank selection signal from the bank decoder 15. This is because the read/write-selection signal Y is in a signal state indicative of a read operation.

Consideration will now be given to a situation in which a password program operation is being performed on the bank-A 21 when a read command is entered into the command register 11 from the exterior of the device as a next command, and a read bank address is also entered into the bank decoder 15. In response to the read command, the read/write-selection signal Y is turned into a signal state indicative of a read operation. If the bank address specifies the bank-B 22, for example, the bank decoder 15 asserts the bank selection signal BPBK. In response to the bank selection signal BPBK selecting the bank-B 22 and the read/write-selection signal Y indicative of a read operation, the bank-B selection circuit 18 instructs the bank-B 22 to perform a read operation. In response, the bank-B 22 carries out a read operation. When this happens, the password program operation of the bank-A 21 continues to be performed concurrently with the read operation of the bank-B 22.

As described above, the nonvolatile semiconductor memory device of a dual-operation type according to the present invention can perform a password program operation in response to a password program command entered without an address indication, and can also perform a read operation on a selected bank while performing a password program operation on another bank.

Figure 3:
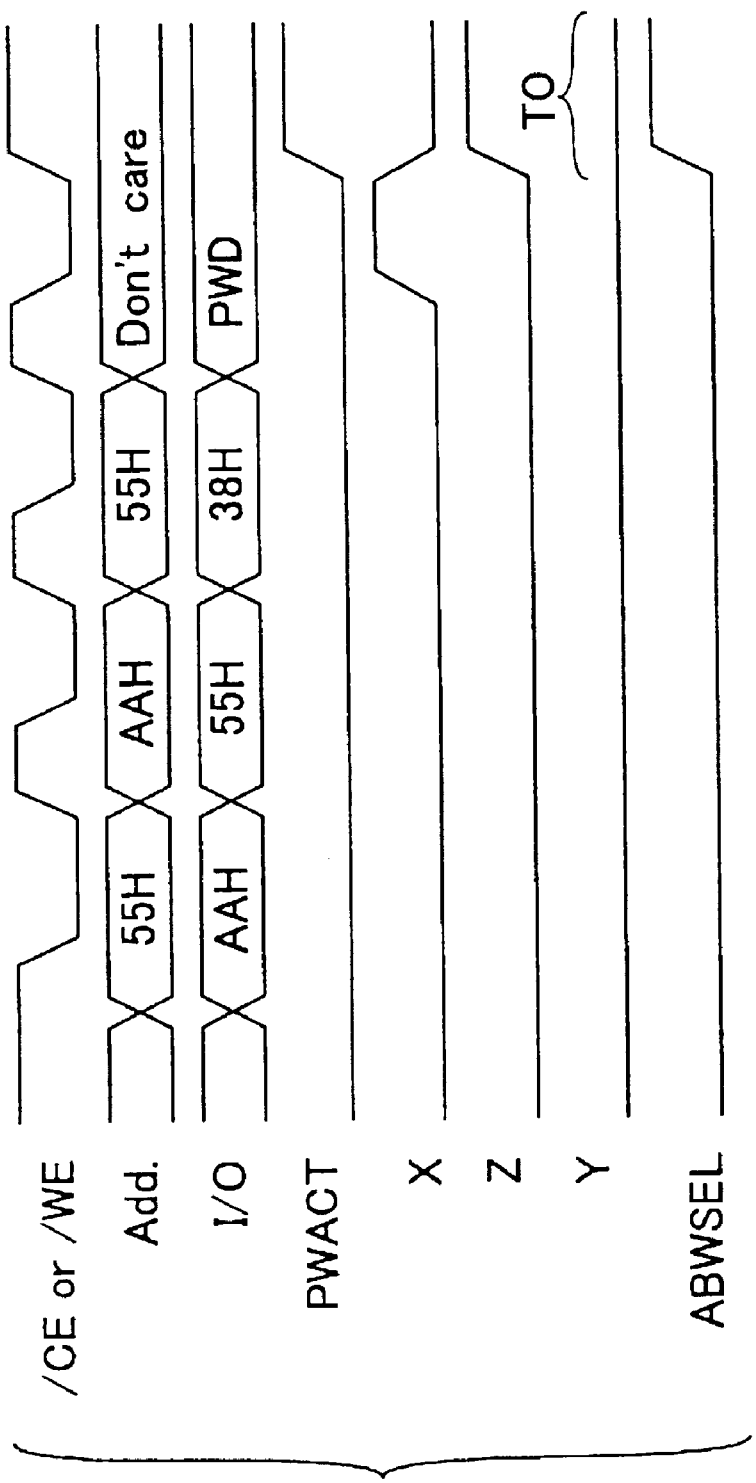
FIG. 3 is a timing chart showing a password program operation of the present invention.

FIG. 3 is a timing chart showing a password program operation of the present invention.

As shown in FIG. 3, a password program command (Add:55H & I/O:38H) is entered in synchronization with a chip-enable signal /CE or a write-enable signal /WE. At the next timing, password data PWD indicative of a password to be set is entered as input/output data I/O. At this timing, the address data Add is irrelevant. The latch-signal generation circuit 14 generates the latch signal X in response to the chip-enable signal /CE and the write-enable signal /WE. Further, a signal Z indicative of a write operation and the password operation signal PWACT are changed to HIGH in response to the password program command.

Since the address input is in a "don't care" condition, it is uncertain which bank selection status will be latched by the bank selection circuits. If the read/write-selection signal Y changes to HIGH (indicative of "write") at the timing T0 shown in FIG. 3, there is a risk that a write operation is set in banks other than the bank-A 21 that has the OTP area associated with it. In the present invention, the read/write-selection signal Y is set to LOW (indicative of "read") through the function of the password operation signal PWACT, thereby setting all the banks in a read state, except for the bank-A 21. The bank-A 21 is set to a write state by the password operation signal PWACT.

Figure 4:
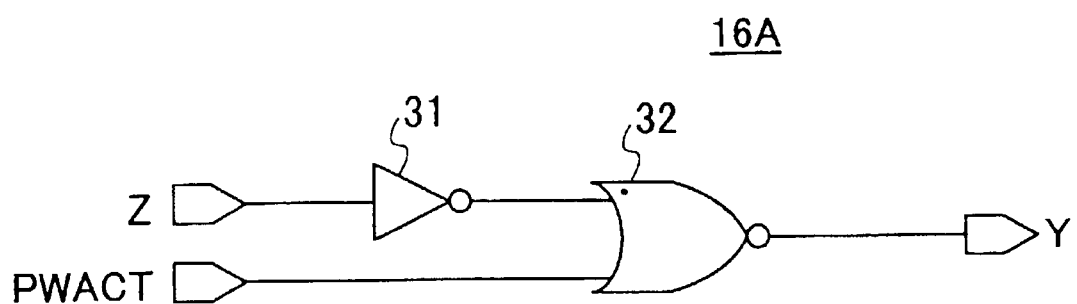
FIG. 4 is a circuit diagram showing an example of a circuit configuration of a bank control circuit.

FIG. 4 is a circuit diagram showing an example of a circuit configuration of the bank control circuit 16A.

The bank control circuit 16A includes an inverter 31 and a NOR circuit 32. When a program or erase command is entered from the exterior of the device, the signal Z is HIGH indicative of receipt of a write command, and the password operation signal PWACT is LOW. In this case, the read/write-selection signal Y is set to HIGH indicative of a write operation. When a password program command is entered from the exterior of the device, the signal Z is HIGH indicative of a write operation, and the password operation signal PWACT is also HIGH. In this case, therefore, the read/write-selection signal Y is set to LOW indicative of a read operation.

Figure 5:
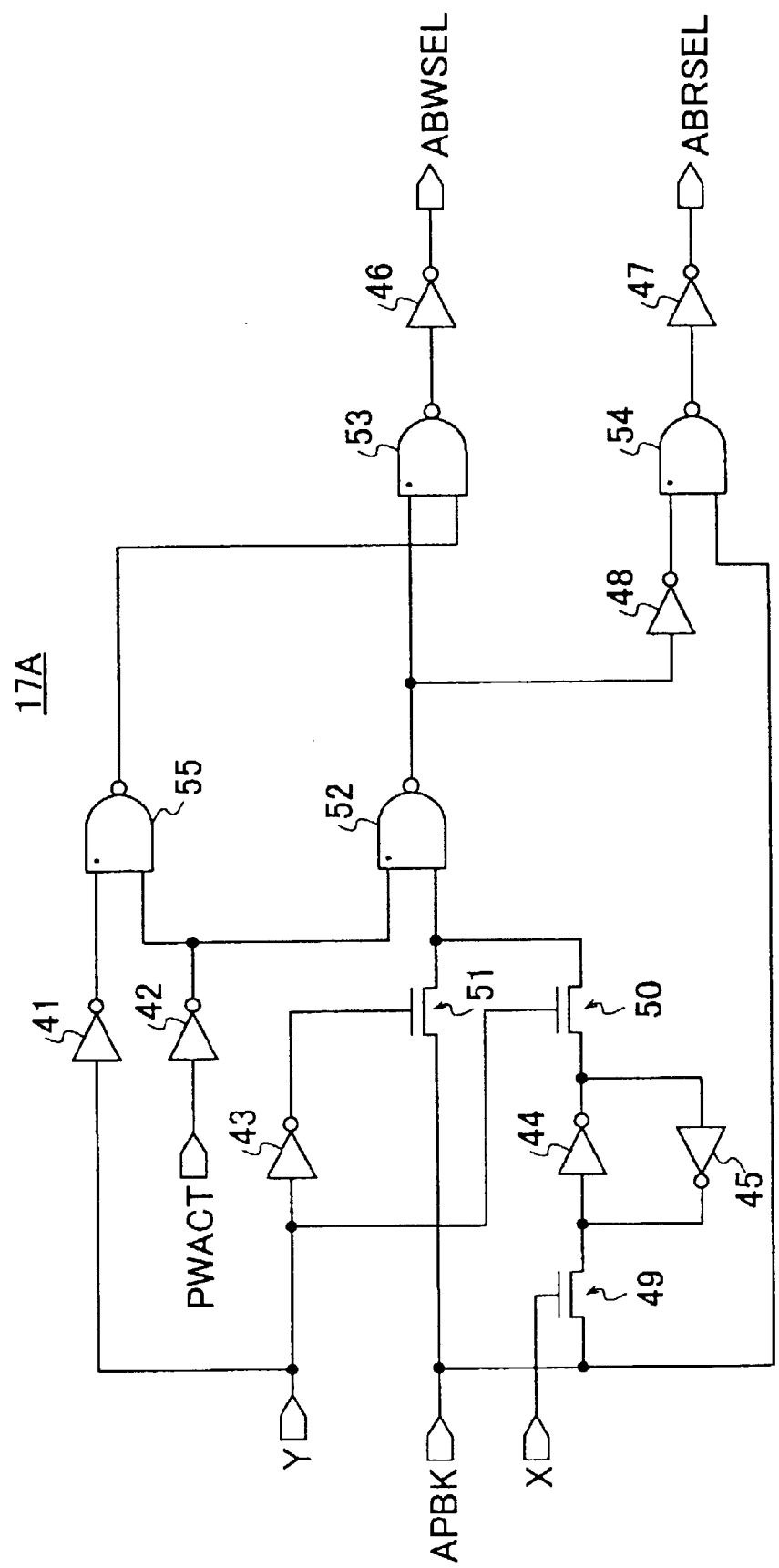
FIG. 5 is a circuit diagram showing an example of a circuit configuration of a bank-A selection circuit.

FIG. 5 is a circuit diagram showing an example of a circuit configuration of the bank-A selection circuit 17A.

The bank-A selection circuit 17A of FIG. 5 includes inverters 41 through 48, NMOS transistors 49 through 51, and NAND circuits 52 through 55. The inverters 44 and 45 together form a latch circuit that latches a bank selection status. The latch circuit latches the bank selection signal APBK in response to the latch signal X where the bank selection signal APBK is set to HIGH in the case of selection of the bank-A 21.

When a program or erase command is entered from the exterior of the device, the read/write-selection signal Y is set to HIGH, and the password operation signal PWACT is set to LOW. Accordingly, the output of the latch circuit (i.e., an inverse of the bank selection signal APBK) is inverted and output as the signal ABWSEL indicative of a write operation through the NMOS transistor 50, the NAND circuit 52, the NAND circuit 53, and the inverter 46. In this manner, the signal ABWSEL indicative of a write operation is set to HIGH when the bank-A 21 is selected.

The output of the latch circuit is also supplied to the NAND circuit 54 through the NMOS transistor 50, the NAND circuit 52, and the inverter 48. Two inputs into the NAND circuit 54 are the bank selection signal APBK and an inverse thereof (i.e., the output of the latch circuit), so that the signal ABRSEL indicative of a read operation is set to LOW regardless of the bank selection status.

In the case where a read command is entered from the exterior of the device, the read/write-selection signal Y is set to LOW, and the password operation signal PWACT is also set to LOW. As a result, the signal ABWSEL indicative of a write operation is set to LOW regardless of the bank selection status. Further, the bank selection signal APBK is supplied to the NAND circuit 54 through the NMOS transistor 51, the NAND circuit 52, and the inverter 48. Since both of the two inputs into the NAND circuit 54 are the bank selection signal APBK, so that the signal ABRSEL indicative of a read operation becomes HIGH in response to bank selection.

In the case where a password program command is entered from the exterior of the device, the read/write-selection signal Y is LOW, and the password operation signal PWACT is HIGH. In this case, the outputs of the NAND circuits 52 and 55 are both HIGH, so that the signal ABWSEL indicative of a write operation is HIGH, and the signal ABRSEL indicative of a read operation is LOW.

Figure 6:
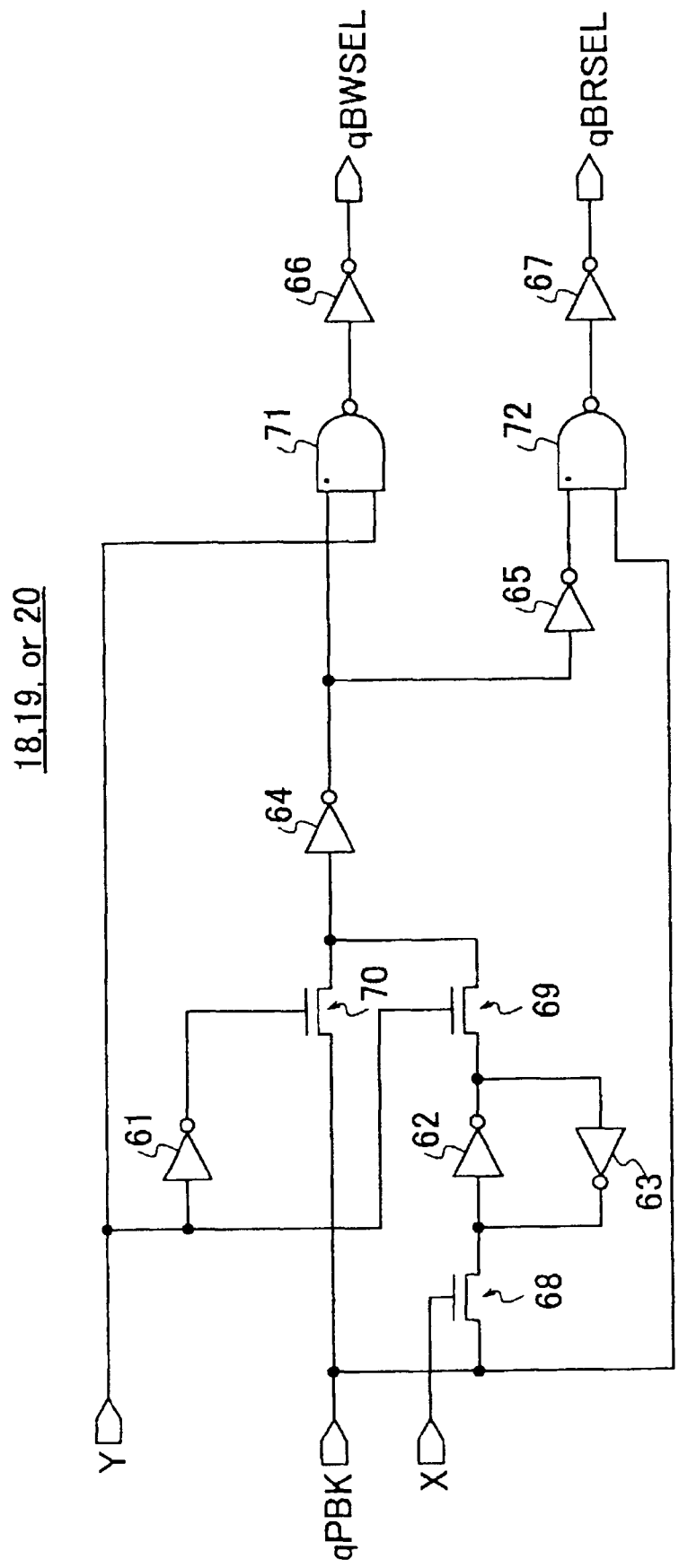
FIG. 6 is a circuit diagram showing an example of a circuit configuration of a bank selection circuit.

FIG. 6 is a circuit diagram showing an example of a circuit configuration of the bank selection circuit. The bank-B selection circuit 18, the bank-C selection circuit 19, and the bank-D selection circuit 20 have the circuit configuration of FIG. 6.

The bank selection circuit of FIG. 6 includes inverters 61 through 67, NMOS transistors 68 through 70, and NAND circuits 71 and 72. The inverters 62 and 63 together form a latch circuit that latches a bank selection status. The latch circuit latches a bank selection signal qPBK (q=B, C, or D) in response to the latch signal X where the bank selection signal qPBK becomes HIGH in the case of pertinent bank selection.

In the case where a program or erase command is entered from the exterior of the device, the read/write-selection signal Y is set to HIGH. Accordingly, the output of the latch circuit (i.e., an inverse of the bank selection signal qPBK) is inverted and output as the signal qBWSEL indicative of a write operation through the NMOS transistor 69, the inverter 64, the NAND circuit 71, and the inverter 66. In this manner, the signal qBWSEL indicative of a write operation is set to HIGH when the relevant bank is selected.

The output of the latch circuit is also supplied to the NAND circuit 72 through the NMOS transistor 69, the inverter 64, and the inverter 65. Two inputs into the NAND circuit 72 are the bank selection signal qPBK and an inverse thereof (i.e., the output of the latch circuit), so that the signal qBRSEL indicative of a read operation is set to LOW regardless of the bank selection status.

In the cases where a read command is entered from the exterior of the device and where a password program command is entered from the exterior of the device, the read/write-selection signal Y is set to LOW. As a result, the signal qBWSEL indicative of a write operation is set to LOW regardless of the bank selection status. Further, the bank selection signal qPBK is supplied to the NAND circuit 72 through the NMOS transistor 70, the inverter 64, and the inverter 65. Since both of the two inputs into the NAND circuit 72 are the bank selection signal qPBK, so that the signal qBRSEL indicative of a read operation becomes HIGH in response to relevant bank selection.

Figure 7:
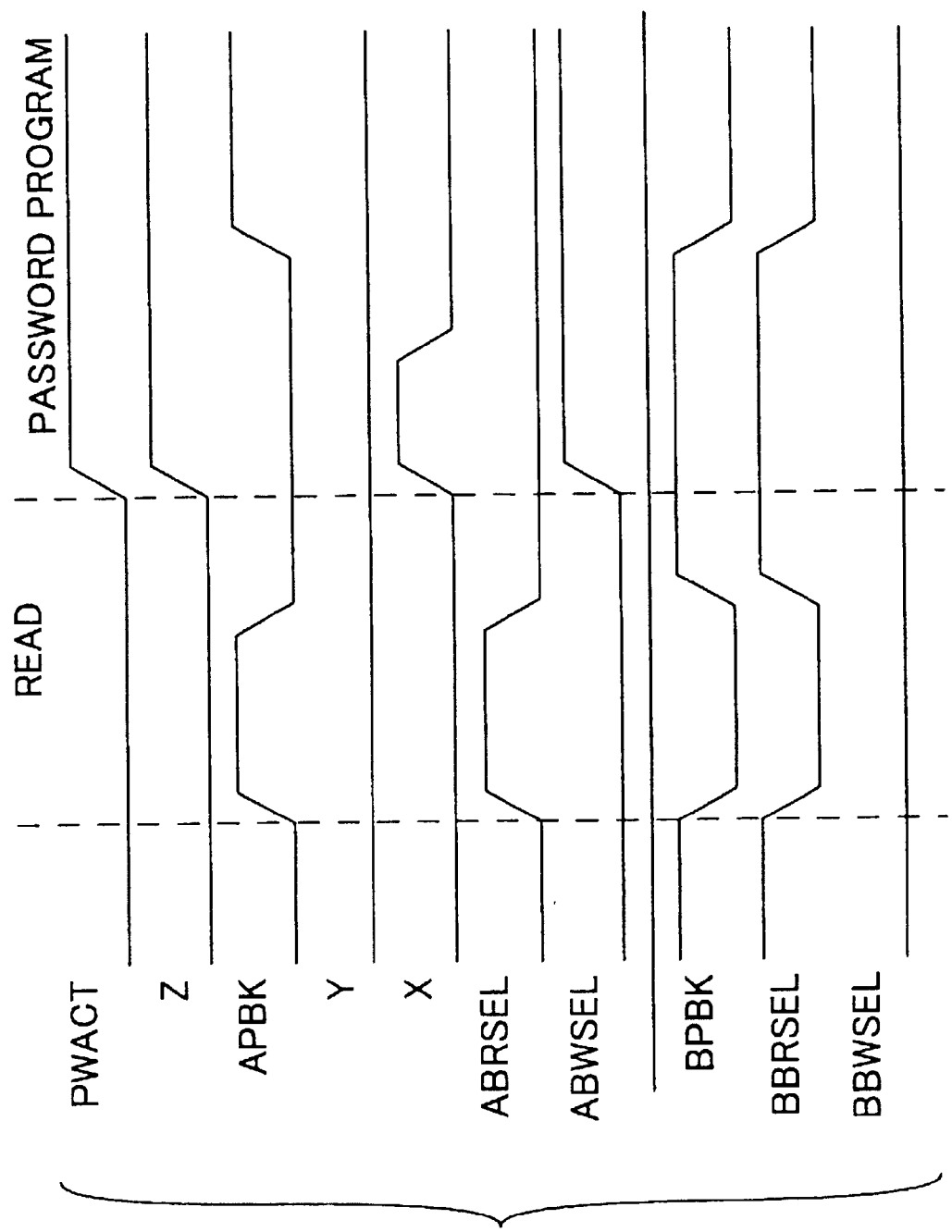
FIG. 7 is a timing chart showing the operation of circuits shown in FIG. 4 through FIG. 6.

FIG. 7 is a timing chart showing the operation-of circuits shown in FIG. 4 through FIG. 6. FIG. 7 shows a case in which the operation starts from a read state and shifts to a password program state, and shows the operation of the bank-A selection circuit 17A and the operation of the bank-B selection circuit 18 as an example of all the banks B through D.

In the read state, the signal Z indicative of a write command and the password operation signal PWACT are LOW, so that the read/write-selection signal Y stays LOW indicative of a read operation. When the bank selection signal APBK becomes HIGH to select the bank-A 21, the signal ABRSEL ordering a read operation of the bank-A 21 is changed to HIGH. When the bank selection signal BPBK becomes HIGH to select the bank-B 22, the signal BBRSEL ordering a read operation of the bank-B 22 is changed to HIGH.

In the password program state that follows, the signal Z indicative of a write operation and the password operation signal PWACT are both HIGH, and the read/write-selection signal Y stays LOW indicative of a read operation. Since the latch signal X is supplied as a HIGH pulse, the bank selection signal APBK that is LOW indicative of the unselected status of the bank-A 21 is latched. Irrespective of such a latching operation, the signal ABWSEL indicative of a write operation is changed to HIGH in response to the HIGH state of the password operation signal PWACT. As noted above, the read/write-selection signal Y stays LOW indicative of a read operation, so that no write operation is set in the bank-B 22 even when the bank selection signal BPBK being HIGH is latched in response to the latch signal X so as to indicate the selected state of the bank-B 22.

In the nonvolatile semiconductor memory device of the present invention as described above, upon entering of a password program command, a bank selection circuit corresponding to the bank associated with the OTP area outputs a write instruction regardless of the bank selection status. Other bank selection circuits output a read instruction when bank selection is made, rather than outputting a write instruction. Accordingly, even if a bank different from the bank associated with the OTP area is selected by the bank selection signal, no write operation is performed on that bank, thereby allowing a read operation to be performed on that bank by virtue of the dual-operation function. As for the bank that is associated with the OTP area, a program operation can properly be performed.

Accordingly, a proper password program operation is performed without any address indication while making it possible to achieve a dual-operation.

Further, the present invention is not limited to these embodiments, but various variations and modifications may be made without departing from the scope of the present invention.

The present application is based on Japanese priority application No. 2001-320909 filed on Oct. 18, 2001, with the Japanese Patent Office, the entire contents of which are hereby incorporated by reference.

What is claimed is:

1. A nonvolatile semiconductor memory device, comprising:
   a plurality of banks including respective memory cell arrays independent of each other;
   a password storage area that is associated with one of the banks;
   a bank decoder which generates a bank selection signal by decoding a bank address;
   a first bank selection circuit which outputs a write instruction or a read instruction to said one of the banks;
   a plurality of second bank selection circuits which outputs a write instruction or a read instruction to the respective banks except for said one of the banks; and
   a command-decode-&-bank-control circuit which controls the first and second bank selection circuits such that receipt of a first command causes one of the first and second bank selection circuits selected by the bank selection signal to output a write instruction or a read instruction, and such that receipt of a second command causes the first bank selection circuit to output a write instruction independently of the bank selection signal, and causes one of the second bank selection circuits selected by the bank selection signal to output a read instruction.

2. The nonvolatile semiconductor memory device as claimed in claim 1, wherein the first command is a command for instructing the banks to perform a write operation or a read operation, and the second command is a command for ordering data writing in the password storage area.

3. The nonvolatile semiconductor memory device as claimed in claim 2, wherein receipt of the second command for ordering data writing in the password storage area is accompanied without receipt of an address indication.

4. The nonvolatile semiconductor memory device as claimed in claim 2, wherein a read operation is performed on one of the banks while a write operation on another one of the banks or a write operation on said password storage area is performed.

5. The nonvolatile semiconductor memory device as claimed in claim 1, wherein said command-decode-&-bank-control circuit includes circuit that outputs a write/read-selection signal indicative of either a write operation or a read operation according to a received command, and wherein the first and second bank selection circuits output the write instruction or the read instruction in response to the write/read-selection signal and the bank selection signal.

6. The nonvolatile semiconductor memory device as claimed in claim 5, wherein said command-decode-&-bank-control circuit sets the write/read-selection signal to a signal state indicative of a read operation in response to the receipt of the second command, and also supplies a signal that instructs the first bank selection circuit to output the write instruction by ignoring the write/read-selection signal and the bank selection signal.

7. A nonvolatile semiconductor memory device, comprising:
   a plurality of banks including respective memory cell arrays independent of each other;
   a bank decoder which generates a bank selection signal by decoding a bank address;
   a plurality of bank selection circuits which are associated with the respective banks, wherein one of the bank selection circuits selected by the bank selection signal outputs a write instruction or a read instruction to a corresponding one of the banks in response to receipt of a command accompanied by an address indication, and wherein a predetermined one of the bank selection circuits outputs a write instruction independently of the bank selection signal in response to receipt of a command with no address indication.

8. The nonvolatile semiconductor memory device as claimed in claim 7, further comprising a password storage area associated with said predetermined one of the bank selection circuits, wherein the command with no address indication is a command for ordering data writing in said password storage area.

9. The nonvolatile semiconductor memory device as claimed in claim 8, wherein the bank selection circuits except for said predetermined one of the bank selection circuits are controlled so as not to output the write instruction in response to the receipt of the command without no address indication.

10. The nonvolatile semiconductor memory device as claimed in claim 8, wherein a read operation is performed on one of the banks while a write operation on another one of the banks or a write operation on said password storage area is performed.

* * * * *